(12) United States Patent
Du et al.

(10) Patent No.: US 11,031,388 B2
(45) Date of Patent: Jun. 8, 2021

(54) SEMICONDUCTOR STRUCTURE AND DRIVING CHIP

(71) Applicant: Silergy Semiconductor Technology (Hangzhou) LTD, Hangzhou (CN)

(72) Inventors: Yicheng Du, Hangzhou (CN); Meng Wang, Hangzhou (CN); Hui Yu, Hangzhou (CN)

(73) Assignee: Silergy Semiconductor Technology (Hangzhou) LTD, Hangzhou (CN)

( * ) Notice: Subject to any disclaimer, the term of this patent is extended or adjusted under 35 U.S.C. 154(b) by 0 days.

(21) Appl. No.: 16/531,270

(22) Filed: Aug. 5, 2019

(65) Prior Publication Data

US 2020/0058643 A1 Feb. 20, 2020

(30) Foreign Application Priority Data

Aug. 17, 2018 (CN) .......................... 201810940876.2

(51) Int. Cl.
*H01L 27/06* (2006.01)
*H01L 21/761* (2006.01)
*H02M 1/08* (2006.01)
*H03K 17/687* (2006.01)

(52) U.S. Cl.
CPC ........ *H01L 27/0635* (2013.01); *H01L 21/761* (2013.01); *H02M 1/08* (2013.01); *H03K 17/6871* (2013.01); *H03K 2217/0063* (2013.01); *H03K 2217/0072* (2013.01)

(58) Field of Classification Search
CPC ........... H01L 21/761; H01L 21/823481; H01L 27/0635; H01L 27/088; H01L 29/7816; H02M 1/08; H03K 17/6871; H03K 2217/0063; H03K 2217/0072
See application file for complete search history.

(56) References Cited

U.S. PATENT DOCUMENTS

| 7,018,899 | B2 | 3/2006 | Sung |
| 7,074,659 | B2 | 7/2006 | Zuniga et al. |
| 7,230,302 | B2 | 6/2007 | Lotfi et al. |
| 7,888,222 | B2 | 2/2011 | You et al. |
| 7,981,739 | B1 | 7/2011 | You et al. |
| 7,999,318 | B2 | 8/2011 | Zuniga et al. |
| 8,063,444 | B2 | 11/2011 | Chang |
| 8,119,507 | B2 | 2/2012 | You |
| 8,293,612 | B2 | 10/2012 | Lee |
| 8,319,283 | B2 | 11/2012 | Min et al. |

(Continued)

*Primary Examiner* — Allan R Wilson
(74) *Attorney, Agent, or Firm* — Michael C. Stephens, Jr.

(57) ABSTRACT

A semiconductor structure can include: a semiconductor substrate having a first region, a second region, and an isolation region disposed between the first and second regions; an isolation structure located in the isolation region, where the isolation structure comprises a first isolation ring having a first doping type, and a second isolation ring having a second doping type, where the first isolation ring is configured to absorb first carriers flowing from the first region to the second region, and where the second isolation ring is configured to absorb second carriers flowing from the second region to the first region; and a lateral blocking component in the isolation structure, where the lateral blocking component is configured to block a lateral flow of the first and second carriers, in order to increase a flow path of the first and second carriers in the semiconductor substrate.

12 Claims, 2 Drawing Sheets

(56) References Cited

U.S. PATENT DOCUMENTS

| | | | |
|---|---|---|---|
| 8,431,450 B1 | 4/2013 | Zuniga et al. | |
| 8,455,340 B2 | 6/2013 | Zuniga et al. | |
| 8,574,973 B1 | 11/2013 | You et al. | |
| 8,581,344 B2 | 11/2013 | Liu | |
| 8,716,790 B2 | 5/2014 | Lotfi et al. | |
| 8,716,795 B2 | 5/2014 | You | |
| 8,912,600 B2 | 12/2014 | You | |
| 9,614,076 B2 * | 4/2017 | Morii | H01L 27/0922 |
| 2009/0189247 A1 * | 7/2009 | Yamamoto | H01L 27/0629 257/510 |
| 2010/0052052 A1 | 3/2010 | Lotfi et al. | |
| 2011/0284987 A1 * | 11/2011 | Yoshihisa | H01L 27/088 257/510 |
| 2012/0139087 A1 * | 6/2012 | Yoshihisa | H01L 21/823481 257/618 |
| 2014/0061787 A1 * | 3/2014 | Kim | H01L 29/66689 257/339 |
| 2014/0320174 A1 | 10/2014 | Lu et al. | |
| 2020/0058644 A1 * | 2/2020 | Du | H01L 21/76237 |

* cited by examiner

SEMICONDUCTOR STRUCTURE AND DRIVING CHIP

RELATED APPLICATIONS

This application claims the benefit of Chinese Patent Application No. 201810940876.2, filed on Aug. 17, 2018, which is incorporated herein by reference in its entirety.

FIELD OF THE INVENTION

The present invention generally relates to semiconductor technology, and more particularly, to driving chips and associated semiconductor structures.

BACKGROUND

Voltage regulators, such as DC-to-DC voltage converters, are used to provide stable voltage sources for various electronic systems. Efficient DC-to-DC converters are particularly useful for battery management in low power devices (e.g., laptop notebooks, cellular phones, etc.). A switching voltage regulator can generate an output voltage by converting an input DC voltage into a high frequency voltage, and then filtering the high frequency input voltage to generate the output DC voltage. For example, the switching regulator can include a switch for alternately coupling and decoupling an input DC voltage source (e.g., a battery) to a load (e.g., an integrated circuit [IC], a light-emitting diode [LED], etc.). Lateral double-diffused metal oxide semiconductor (LDMOS) transistors may be utilized in switching regulators due to their performance in terms of a tradeoff between their specific on-resistance ($R_{dson}$) and drain-to-source breakdown voltage ($BV_{d\_s}$).

DETAILED DESCRIPTION

Figure 1:
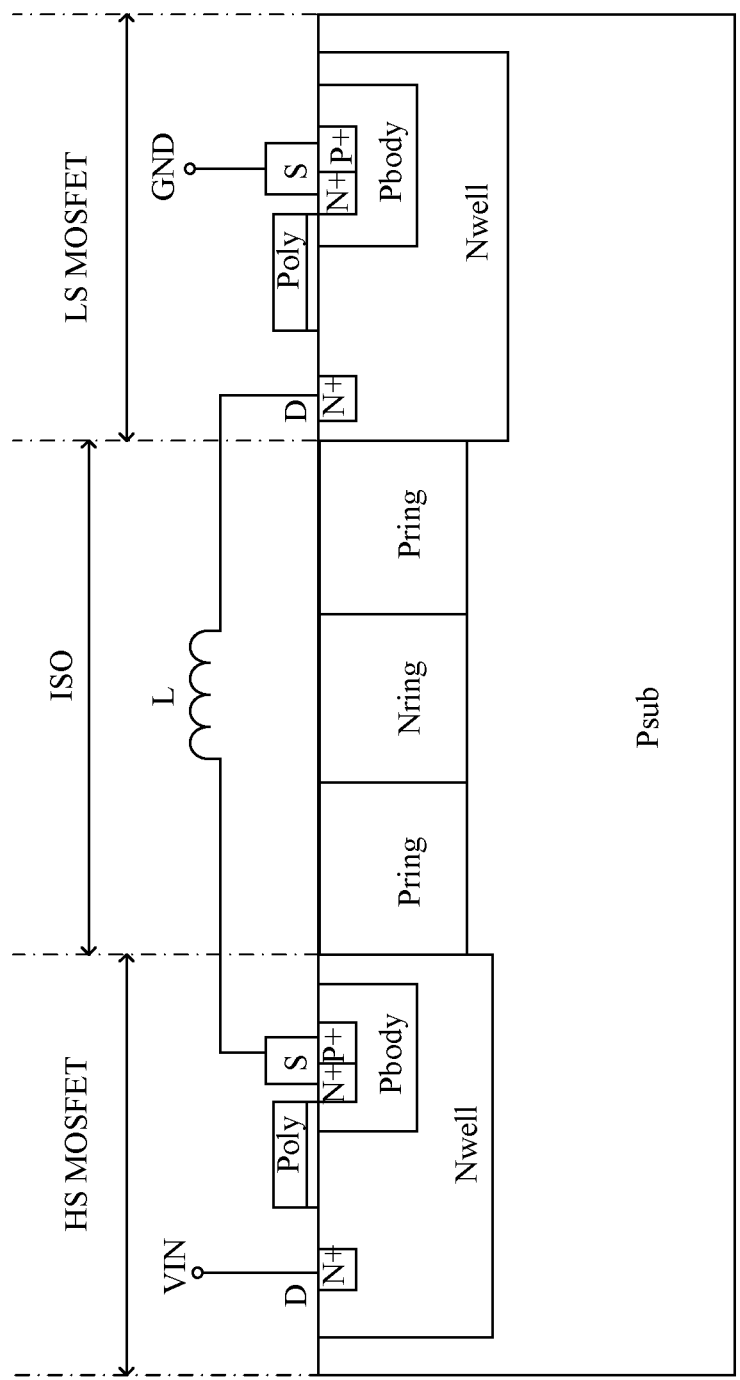
FIG. 1 is a partial cross-sectional view of an example motor driving chip.

Reference may now be made in detail to particular embodiments of the invention, examples of which are illustrated in the accompanying drawings. While the invention may be described in conjunction with the preferred embodiments, it may be understood that they are not intended to limit the invention to these embodiments. On the contrary, the invention is intended to cover alternatives, modifications and equivalents that may be included within the spirit and scope of the invention as defined by the appended claims. Furthermore, in the following detailed description of the present invention, numerous specific details are set forth in order to provide a thorough understanding of the present invention. However, it may be readily apparent to one skilled in the art that the present invention may be practiced without these specific details. In other instances, well-known methods, procedures, processes, components, structures, and circuits have not been described in detail so as not to unnecessarily obscure aspects of the present invention.

Semiconductor devices are generally manufactured using two complex manufacturing processes: front-end manufacturing and back-end manufacturing. Front-end manufacturing may involve the formation of a plurality of die on the surface of a semiconductor wafer. Each die on the wafer may contain active and passive electrical components, which are electrically connected to form functional electrical circuits. Active electrical components, such as transistors and diodes, have the ability to control the flow of electrical current. Passive electrical components, such as capacitors, inductors, resistors, and transformers, create a relationship between voltage and current necessary to perform electrical circuit functions.

Passive and active components can be formed over the surface of the semiconductor wafer by a series of process steps including doping, deposition, photolithography, etching, and planarization. Doping introduces impurities into the semiconductor material by techniques such as ion implantation or thermal diffusion. The doping process modifies the electrical conductivity of semiconductor material in active devices, transforming the semiconductor material into an insulator, conductor, or dynamically changing the semiconductor material conductivity in response to an electric field or base current. Transistors contain regions of varying types and degrees of doping arranged as necessary to enable the transistor to promote or restrict the flow of electrical current upon the application of the electric field or base current.

Active and passive components are formed by layers of materials with different electrical properties. The layers can be formed by a variety of deposition techniques determined in part by the type of material being deposited. For example, thin film deposition may involve chemical vapor deposition (CVD), physical vapor deposition (PVD), electrolytic plating, and electroless plating processes. Each layer is generally patterned to form portions of active components, passive components, or electrical connections between components.

The layers can be patterned using photolithography, which involves the deposition of light sensitive material, e.g., photoresist, over the layer to be patterned. A pattern is transferred from a photomask to the photoresist using light. The portion of the photoresist pattern subjected to light is removed using a solvent, exposing portions of the underlying layer to be patterned. The remainder of the photoresist may be removed, leaving behind a patterned layer. Alternatively, some types of materials can be patterned by directly depositing the material into the areas or voids formed by a previous deposition/etch process using techniques such as electroless and electrolytic plating.

Depositing a thin film of material over an existing pattern can exaggerate the underlying pattern and create a non-uniformly flat surface. A uniformly flat surface may be used to produce smaller and more densely packed active and passive components. Planarization can be used to remove material from the surface of the wafer and produce a uniformly flat surface. Planarization can involve polishing the surface of the wafer with a polishing pad. An abrasive material and corrosive chemical are added to the surface of the wafer during polishing. The combined mechanical action of the abrasive and corrosive action of the chemical removes any irregular topography, resulting in a uniformly flat surface.

Back-end manufacturing refers to cutting or singulating the finished wafer into the individual die and then packaging the die for structural support and environmental isolation. To singulate the die, the wafer is scored and broken along non-functional regions of the wafer called saw streets or scribes. The wafer may be singulated using a laser cutting tool or saw blade. After singulation, the individual die are mounted to a package substrate that includes pins or contact pads for interconnection with other system components.

Contact pads formed over the semiconductor die can then be connected to contact pads within the package. The electrical connections can be made with solder bumps, stud bumps, conductive paste, or wire bonds, as a few examples. An encapsulant or other molding material may be deposited over the package to provide physical support and electrical isolation. The finished package can then be inserted into an electrical system and the functionality of the semiconductor device is made available to the other system components.

The power switch in a switching converter/regulator may be a semiconductor transistor (e.g., a metal-oxide-semiconductor field-effect transistor [MOSFET], an insulated gate bipolar transistor [IGBT], etc.). A laterally diffused metal oxide semiconductor (LDMOS) is widely used in switching regulators as the main power switch.

Referring now to FIG. 1, shown is a partial cross-sectional view of an example motor driving chip. In the interior of the drive chip, such as motor, multiple half-bridge circuits can be included, and the inductive load may be connected between the two half-bridge circuits. In this example motor driving chip, high-voltage side HS MOSFET of one of the multiple of half-bridge circuits of the driving chip can be coupled to low-voltage side LS MOSFET of the other half-bridge circuit through inductance L. High-voltage side HS MOSFET and low-voltage side LS MOSFET may both be located in the N-type well region Nwell, and can include P-type body region Pbody located in the well region Nwell, source region N+ and body contact region P+ located in body region Pbody, the gate dielectric layer, gate conductor Poly on the gate dielectric layer, and drain region N+. For example, drain electrode D of high-voltage side HS MOSFET can connect to input voltage VIN. The connected node between source electrode S and the substrate electrode can be coupled to drain electrode D of low-voltage side LS MOSFET through inductance L. Source electrode S of the low-voltage side LS MOSFET can connect to the ground voltage GND.

When the driving chip operates normally, the two half-bridge circuits can realize the conduction of the forward MOSFET and the freewheeling process of the reverse body diode through the intermediate inductance L. For example, during the freewheeling process of the reverse body diode, the parasitic PNPN structure between high-voltage side HS MOSFET and low-voltage side LS MOSFET may be in a forward bias state, while PNP (Pbody-Nwell-Psub) and NPN (Nwell-Psub-Nwell) are turned on in turn. When the collector current (or hole carriers) of the high-voltage side PNP reaches the low-voltage side and acts as the base current of the low-voltage side NPN to promote Nwell of the low-voltage side to inject electrons into substrate Psub, and when the collector current (or electron carriers) of the low-voltage side NPN reaches N-type well of the high-voltage side and acts as the base current of the high-voltage side PNP, the PNPN thyristor can be turned on and the driving chip may fail due to uncontrolled internal currents.

One solution is to provide isolation region ISO between high-voltage side HS MOSFET and low-voltage side LS MOSFET, and P-type isolation ring Pring and N-type isolation ring Nring may be formed in isolation region ISO. P-type isolation ring Pring can absorb the hole carriers injected from the high-voltage side to the low-voltage side, and N-type isolation ring Nring can absorb the electron carriers injected from the low-voltage side to the high-voltage side. However, a very large area may be needed in order to ensure that the chip does not trigger the conduction of the PNPN thyristor at rated voltage and rated current.

In particular embodiments, a semiconductor structure can include a semiconductor substrate having first and second regions, and an isolation region between the first and second regions. An isolation structure may be disposed in the isolation region. The isolation structure can include a first isolation ring having a first doping type, and a second isolation ring having a second doping type. The first isolation ring can absorb first carriers flowing from the first region to the second region, and the second isolation ring can absorb second carriers flowing from the second region to the first region. The isolation structure may further include a lateral blocking component for blocking lateral flow of the first and second carriers in order to increase the flow path of the first and second carriers in the semiconductor substrate.

For example, the first isolation ring and the second isolation ring are both symmetrical about a first axis, the first region and the second region are also symmetrical about the first axis, and the isolation region is also symmetrical about the first axis, the isolation structure composed of the first isolation ring and the second isolation ring is also symmetrical about the first axis, the first axis is perpendicular to a second axis, the first region, the isolation region and the second region are sequentially arranged along the direction of the second axis. Moreover, the lateral blocking component is further used to increase the absorption of the first isolation ring to first carriers and increase the absorption of the second isolation ring to the second carriers.

In the semiconductor structure of certain embodiments, the "first" carriers are one of holes and electrons, and the "second" carriers are another one of holes and electrons. In most examples, the first carriers are hole carriers, the second carriers are electron carriers, the "first" doping type is a P-type, and the "second" doping type is a N-type. In addition, the voltage/potential connected to the first isolation ring may be lower than the voltage/potential connected to the second isolation ring.

Figure 2:
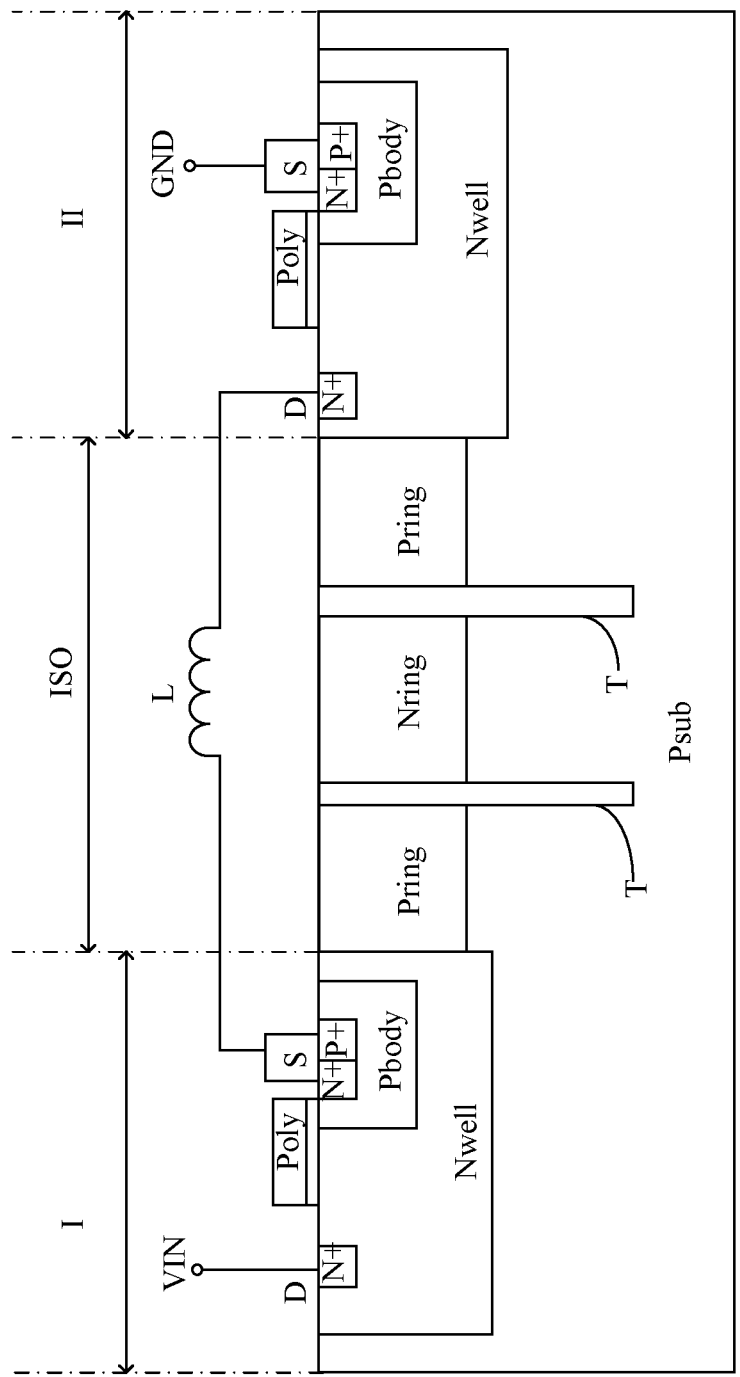
FIG. 2 is a cross-sectional view of an example semiconductor structure, in accordance with embodiments of the present invention.

Referring now to FIG. 2, shown is a cross-sectional view of an example semiconductor structure, in accordance with embodiments of the present invention. In this particular example, the semiconductor substrate is P-type semiconductor substrate Psub, region I of semiconductor substrate Psub includes N-type first well region Nwell. Region II of semiconductor substrate Psub may include N-type second well region Nwell. A first N-type MOSFET can be disposed in first well region Nwell, and a second N-type MOSFET may be disposed in second well region Nwell. The first and second N-type MOSFETs may both include P-type body region Pbody located in a source area (e.g., an area where a source region of the transistor is located), N-type source region N+ located in body region Pbody, a drain region N+ in the drain area (e.g., the area where the drain region of the transistor is located), a gate oxide layer on the surface of semiconductor substrate Psub, and a gate conductor Poly on the gate oxide layer. Further, the two MOSFETs may also both include P-type body contact region P+ located in body region Pbody, and body contact region P+ can connect to the same potential as the source region N+.

For example, relative to the second N-type MOSFET, the first N-type first MOSFET can be a high-voltage transistor. That is, the voltage applied to the first N-type MOSFET may be greater than the voltage applied to the second N-type MOSFET. For example, the first N-type MOSFET can be configured as a high-voltage side transistor of a first half-bridge circuit, and the second N-type MOSFET may be configured as a low-voltage side transistor of the second half-bridge circuit. Therefore, the first potential connected to drain electrode D of the first N-type MOSFET may be greater than the second potential connected to source electrode S of the second N-type MOSFET, and source electrode S of the first N-type MOSFET can be coupled to the drain electrode D of the second N-type MOSFET through inductive element L. For example, the first potential may be the potential of input power source VIN, and the second potential may be the potential of reference ground GND.

In this particular example, P-type body region Pbody of the first N-type MOSFET, first well region Nwell, and semiconductor substrate Psub may form a parasitic PNP transistor. Also, first well region Nwell, semiconductor substrate Psub, and a N-type region of second N-type MOSFET may form a parasitic NPN transistor. For example, the N-type region (e.g., the second well region Nwell) may be adjacent to semiconductor substrate Psub. In other examples, if region II does not include second well region Nwell, the N-type region may be drain region N+ of the second N-type MOSFET.

When the first and second N-type MOSFETs are both in the off state, and the body diodes of the first and second N-type MOSFETs are in the reverse freewheeling state through inductance L, a parasitic PNPN thyristor formed by the PNP and NPN transistors may be in a forward bias state, accompanied by the conduction of the PNP and NPN transistors. When the PNP transistor is turned on, the first carriers may flow from the PNP transistor toward region II. When the NPN transistor is turned on, the second carrier may flow from the NPN transistor toward region I. If the flow of the first and second carriers is not prevented at this time, when the first carriers reach region II, which further promotes second well region Nwell to inject the more second carriers into the semiconductor substrate Psub, and the more second carriers reach region I, the PNPN thyristor may turn on and cause the semiconductor structure to fail due to uncontrolled internal currents.

In this particular example, first isolation ring Pring can include a first portion adjacent to region I, and a second portion adjacent to region II. Also, second isolation ring Nring can be located between the first and second portions. When the first carriers (e.g., hole carriers) flow from region I to region II and flow through isolation region ISO, since first isolation ring Pring can connect to a low potential, the hole carriers may flow to the low potential direction, and thus a large amount of the hole carriers may flow toward first isolation ring Pring to be absorbed by first isolation ring Pring and be discharged. As a result, the amount of the first carriers flowing to region II may be reduced. When the second carriers (e.g., electron carriers) flow from region II toward region I and flow through isolation region ISO, since second isolation ring Nring can connect to a high potential, the electrons may flow to the high potential direction, and thus a large amount of the electron carriers may flow toward second isolation ring Nring to be absorbed by second isolation ring Nring and be discharged. As a result, the amount of the second carriers flowing to region I may be reduced.

In order to reduce the area occupied by isolation region ISO, the area of first isolation ring Pring and the area of second isolation ring Nring may both be reduced as much as possible. However, the reduction of the area of first isolation ring Pring and second isolation ring Nring can affect the absorption ability of the two isolation rings to the first and second carriers, such that the PNPN thyristor may still be in an on state, thereby causing the semiconductor structure to fail. In particular embodiments, isolation region ISO may further provided with a lateral blocking component for blocking the lateral flow of the first and second carriers in order to increase the flow path of the first and second carriers in the semiconductor substrate. For example, the lateral blocking component can increase the flow path of the first carriers in region I of the semiconductor substrate, and may increase the flow path of the second carriers in region II of the semiconductor substrate.

Since the flow paths of the first and second carriers may be increased in semiconductor substrate Psub, for the electron carriers, the flow path of the electron carriers may be increased in region II of semiconductor substrate Psub, which can increase the amount of the electron carriers recombined with the holes in semiconductor substrate Psub. In addition, the lateral flow of the electron carriers may be blocked by the lateral blocking component during the flow of the electron carriers. As a result, more electrons may flow to second isolation ring Nring of a higher potential to be absorbed and discharged by second isolation ring Nring. That is, the presence of the lateral blocking component can increase the absorption of second isolation ring Nring to the second carriers. In this case, even if the area of second isolation ring Nring made relatively small, the second carriers can be effectively absorbed.

Similarly, for the hole carriers, the lateral flow of the hole carriers to region II may be blocked by the lateral blocking component. The flow path of the hole carriers can be increased in region I of semiconductor substrate Psub, thereby more holes may flow to first isolation ring Pring of a lower potential to be absorbed and discharged by first isolation ring Pring. That is, the presence of the lateral blocking component can increase the absorption of first isolation ring Pring to the first carriers. In this case, even if the area of first isolation ring Pring is set as relatively small, the first carriers can be effectively absorbed.

In particular embodiments, the first and second isolation rings may be disposed in the isolation region in order to respectively absorb the first and second carriers. Further, a lateral blocking component for blocking the lateral flow of the first and second carriers may also be disposed in the isolation region, in order to increase a flow path of the first and second carriers in the semiconductor substrate. Therefore, the area of the first and second isolation rings can be set to be relatively small, thereby effectively reducing the overall area of the driving chip.

In this particular example, the lateral blocking component can include one or more trenches T extending from the surface of semiconductor substrate Psub into the semiconductor substrate. For example, trench T may be filled by an insulating material, or the insulating material may at least cover the sidewalls and bottom of the trench. Along the thickness direction of the semiconductor substrate (e.g., the thickness direction is perpendicular to the arrangement direction of regions I and II, and the isolation region), the depth of extension of trench T can be greater than the depth of extension of first isolation ring Nring and second isolation ring Pring in semiconductor substrate Psub.

Further, in order to enable the lateral blocking component to better block the lateral flow of the first and second carriers to increase the absorption of the first isolation ring to the first carriers, and to increase the absorption of the second isolation ring to the second carriers, at least one trench T may be disposed between the first portion of first isolation ring Pring and second isolation ring Nring, and/or at least one trench T may be disposed between the second portion of first isolation ring Pring and second isolation ring Nring. In other examples, trench T may be disposed at other locations of isolation region ISO, as long as the lateral flow of the first and second carriers can be blocked to increase the flow path of the first and second carriers in the semiconductor substrate, and to increase absorption of the first isolation ring to the first carriers and/or the absorption of the second isolation ring to the second carriers.

Particular embodiments may also include a driving integrated circuit or chip, such as a motor driving chip. The driving chip can include the semiconductor structure as described herein and the inductive element. For example, the first N-type MOSFET may be configured as a high-voltage side transistor of the first half-bridge circuit in the driving chip, and the second N-type MOSFET may be configured as a low-voltage side transistor of the second half-bridge circuit in the driving chip. Also, a source electrode of the first N-type MOSFET can be coupled to a drain electrode of the second N-type MOSFET through an inductive element.

The embodiments were chosen and described in order to best explain the principles of the invention and its practical applications, to thereby enable others skilled in the art to best utilize the invention and various embodiments with modifications as are suited to particular use(s) contemplated. It is intended that the scope of the invention be defined by the claims appended hereto and their equivalents.

What is claimed is:

1. A semiconductor structure, comprising:
    a) a semiconductor substrate having a first region, a second region, and an isolation region disposed between the first and second regions;
    b) an isolation structure located in the isolation region, wherein the isolation structure comprises a first isolation ring having a first doping type, and a second isolation ring having a second doping type, wherein the first isolation ring is configured to absorb first carriers flowing from the first region to the second region, the second isolation ring is configured to absorb second carriers flowing from the second region to the first region, the first isolation ring comprises a first portion adjacent to the first region, and a second portion adjacent to the second region, and the second isolation ring is located between the first and second portions of the first isolation ring; and
    c) a lateral blocking component formed between the first isolation ring and the second isolation ring in the isolation structure, wherein the lateral blocking component comprises a trench configured to block a lateral flow of the first and second carriers, in order to increase a flow path of the first and second carriers in the semiconductor substrate.

2. The semiconductor structure of claim 1, wherein the lateral blocking component comprises:
    a) the trench extending from a surface of the semiconductor substrate into the semiconductor substrate;
    b) an insulating material filled in the trench, wherein the insulating material at least covers sidewalls and a bottom of the trench; and
    c) wherein a depth of the trench in the semiconductor substrate is greater than a depth of the first isolation ring and the second isolation ring in the semiconductor substrate along a thickness direction of the semiconductor substrate.

3. The semiconductor structure of claim 1, wherein the trench is located between the first portion of the first isolation ring and the second isolation ring.

4. The semiconductor structure of claim 1, wherein the trench is located between the second isolation ring and the second portion of the first isolation ring.

5. A semiconductor structure, comprising:
    a) a semiconductor substrate having a first region, a second region, and an isolation region disposed between the first and second regions;
    b) an isolation structure located in the isolation region, wherein the isolation structure comprises a first isolation ring having a first doping type, and a second isolation ring having a second doping type, wherein the first isolation ring is configured to absorb first carriers flowing from the first region to the second region, and wherein the second isolation ring is configured to absorb second carriers flowing from the second region to the first region;
    c) a lateral blocking component formed between the first isolation ring and the second isolation ring in the isolation structure, wherein the lateral blocking component comprises a trench configured to block a lateral flow of the first and second carriers, in order to increase a flow path of the first and second carriers in the semiconductor substrate; and
    d) wherein the first carriers are hole carriers, the second carriers are electron carriers the first doping type is a P-type, the second doping type is an N-type and the potential connected to the first isolation ring is lower than a potential connected to the first isolation ring is lower than a potential connected to the second isolation ring.

6. The semiconductor structure of claim 5, wherein:
    a) the semiconductor substrate is a P-type semiconductor substrate, the first region comprises an N-type first well region, a first N-type MOSFET is disposed in the first well region, and a second N-type MOSFET is disposed in the second region;
    b) a P-type body region of the first N-type MOSFET, the first well region, and the semiconductor substrate form a parasitic PNP transistor;
    c) the first well region, the semiconductor substrate, and a N-type region of the second N-type MOSFET form a parasitic NPN transistor, wherein the N-type region is adjacent to the semiconductor substrate;
    d) the first carriers flow from the PNP transistor toward the second region when the PNP transistor is turned on; and
    e) the second carriers flow from the NPN transistor toward the first region when the NPN transistor is turned on.

7. The semiconductor structure of claim 6, wherein the second region comprises an N-type second well region, the second N-type MOSFET is disposed in the second well region, and the N-type region is the second well region.

8. The semiconductor structure of claim 6, wherein:
    a) a drain electrode of the first N-type MOSFET is connected to a first potential, and a source electrode of the first N-type MOSFET is coupled to a drain electrode of the second N-type MOSFET;
    b) a source electrode of the second N-type MOSFET is connected to a second potential; and
    c) the first potential is greater than the second potential.

9. The semiconductor structure of claim 6, wherein:
    a) the first N-type MOSFET is configured as a high-voltage side transistor of a first half-bridge circuit;
    b) the second N-type MOSFET is configured as a low-voltage side transistor of a second half-bridge circuit; and
    c) a source electrode of the first N-type MOSFET is coupled to a drain electrode of the second N-type MOSFET through an inductive element.

10. The semiconductor structure of claim 6, wherein a source region of the first N-type MOSFET is located in the P-type body region.

11. The semiconductor structure of claim 1, wherein the trench is configured to increase the absorption of the first isolation ring to the first carrier, and to increase the absorption of the second isolation ring to the second carrier.

12. A driving chip, comprising the semiconductor structure of claim 6 and an inductive element, wherein:
   a) the first N-type MOSFET is configured as a high-voltage side transistor of a first half-bridge circuit of the driving chip;
   b) the second N-type MOSFET is configured as a low-voltage side transistor of a second half-bridge circuit of the driving chip; and
   c) a source electrode of the first N-type MOSFET is coupled to a drain electrode of the second N-type MOSFET through the inductive element.

\* \* \* \* \*